United States Patent [19]

Ono et al.

[11] Patent Number: 4,811,128
[45] Date of Patent: Mar. 7, 1989

[54] DIGITAL SIGNAL RECORDING AND REPRODUCING APPARATUS HAVING ROTARY MAGNETIC HEADS

[75] Inventors: Tsuyoshi Ono, Yamato; Yasuhiro Yamada, Fussa; Kazuo Hikawa, Mitaka; Atsushi Hayami, Yamato; Yasuo Inoue, Kawasaki; Fumiaki Ono, Fujisawa, all of Japan

[73] Assignee: Victor Company of Japan, Yokohama, Japan

[21] Appl. No.: 10,498

[22] Filed: Feb. 3, 1987

[30] Foreign Application Priority Data

Feb. 14, 1986 [JP] Japan ................................. 61-30119
Sep. 30, 1986 [JP] Japan ................................ 61-231530
Oct. 1, 1986 [JP] Japan ................................ 61-233444

[51] Int. Cl.$^4$ ...................... G11B 15/46; G11B 19/28
[52] U.S. Cl. ..................................... 360/73.12; 360/70
[58] Field of Search .................. 360/10.2, 18, 27, 32, 360/51, 70, 73

[56] References Cited

U.S. PATENT DOCUMENTS

| 4,376,268 | 3/1983 | Moriya et al. | 360/70 X |
| 4,485,337 | 11/1984 | Sandusky | 360/73 X |
| 4,507,592 | 3/1985 | Anderson | 360/73 X |
| 4,607,298 | 8/1986 | Yamashita | 360/73 |
| 4,626,936 | 12/1986 | Yoshino | 360/70 |

FOREIGN PATENT DOCUMENTS

| 0137346 | 4/1985 | European Pat. Off. . |
| 0158166 | 10/1985 | European Pat. Off. . |
| 3522870 | 1/1986 | Fed. Rep. of Germany . |
| 60-658 | 1/1985 | Japan . |

Primary Examiner—John H. Wolff
Attorney, Agent, or Firm—Ladas & Parry

[57] ABSTRACT

A digital signal recording and reproducing apparatus comprises rotary magnetic heads for recording and reproducing digital signals on and from a magnetic tape, where the digital signals include a digitally modulated information signal and a specific signal which is in a frequency region different from that of the digitally modulated information signal, a circuit for frequency-selecting the specific signal from the reproduced digital signals, a circuit for measuring a period of the specific signal which is frequency-selected, a circuit for calculating a rate of change of a transmission rate of the reproduced digital signals from the measured period of the specific signal and for detecting a relative linear velocity between the rotary magnetic head and the magnetic tape.

9 Claims, 13 Drawing Sheets

TAPE TRANSPORT DIRECTION

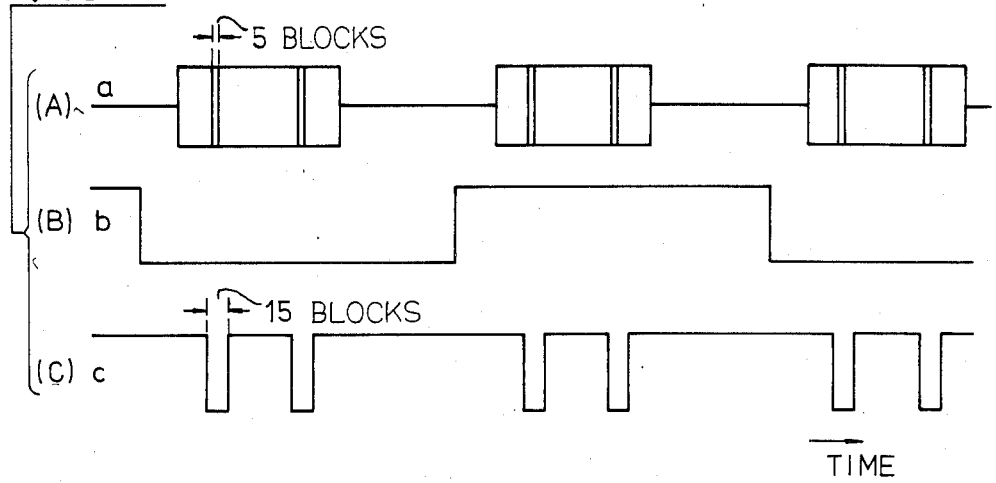
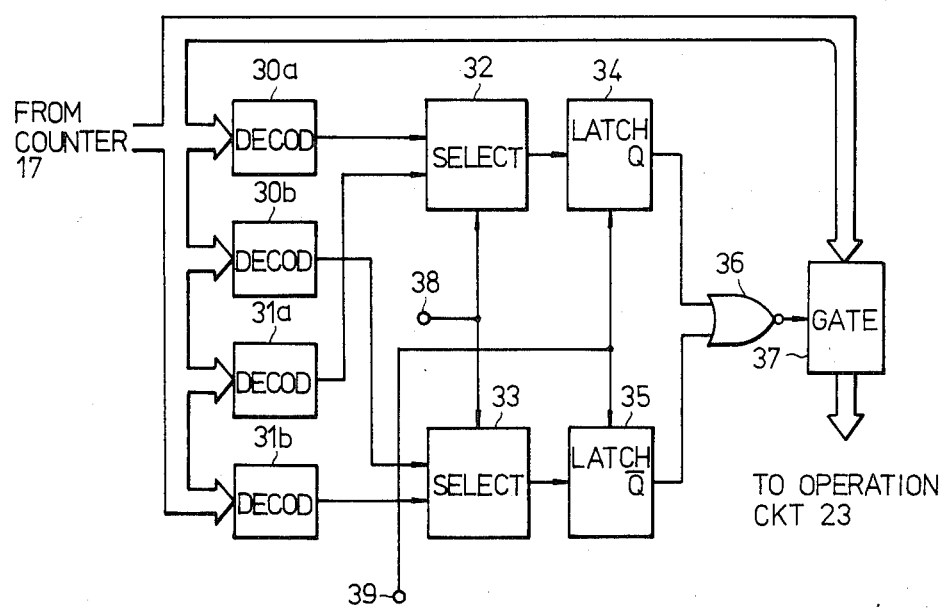

TIME

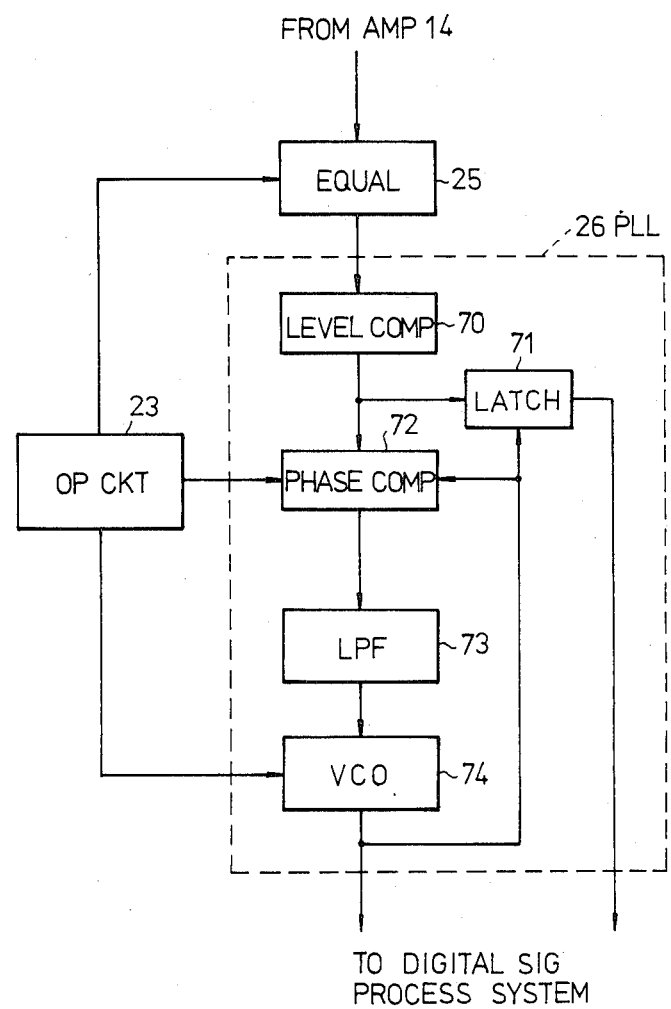

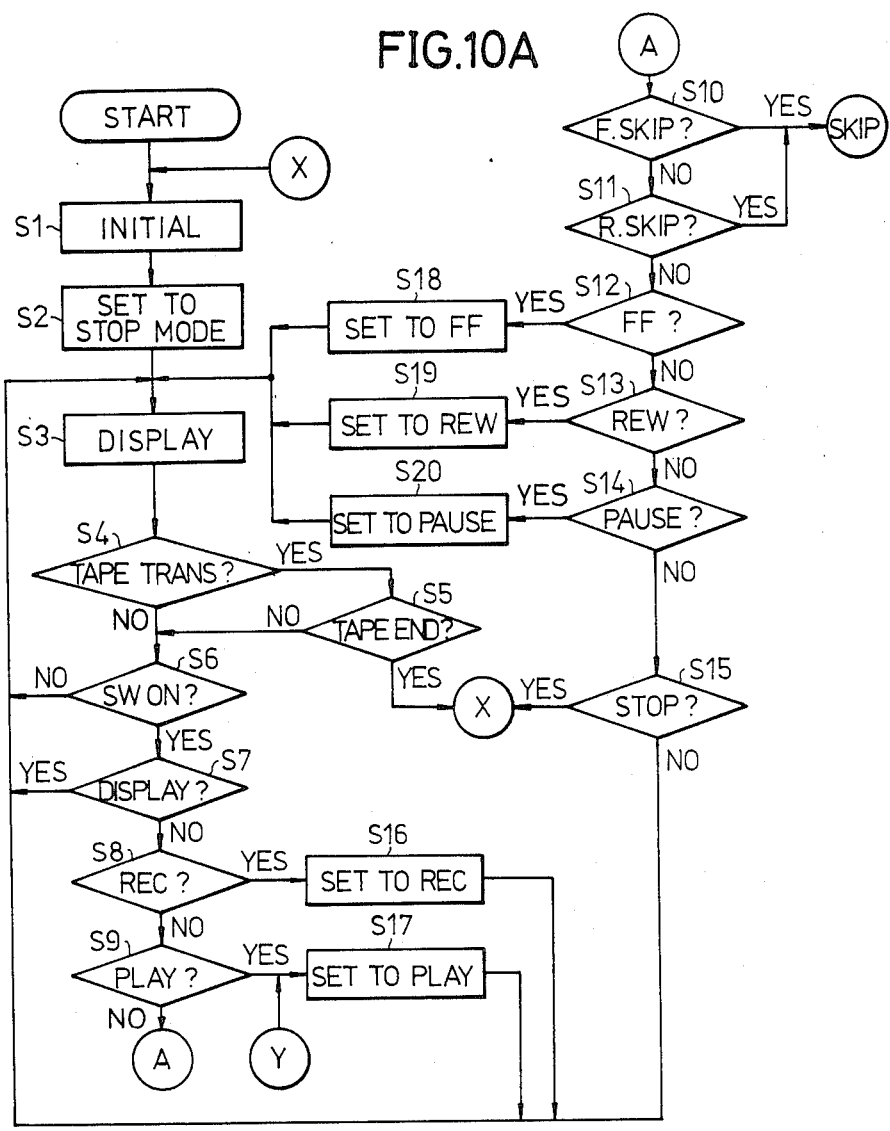

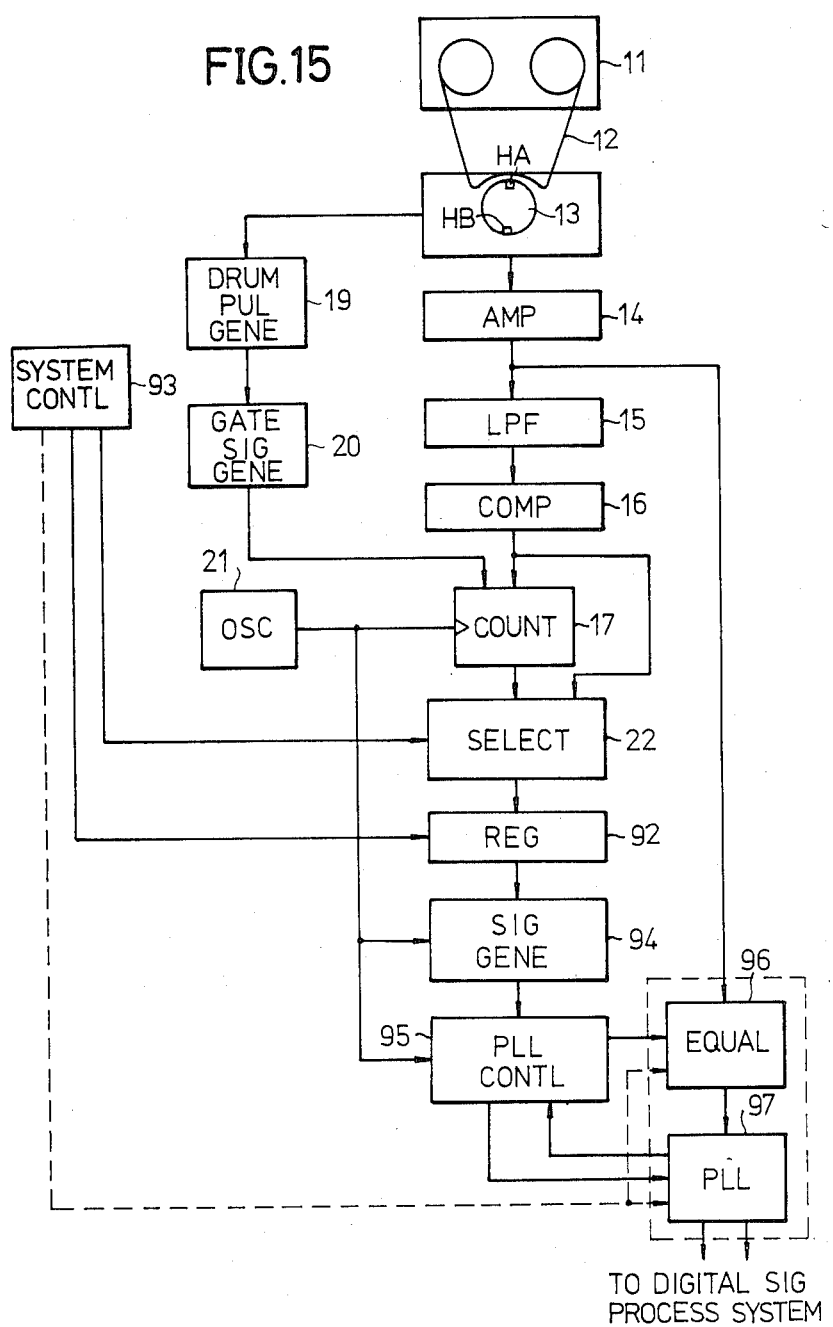

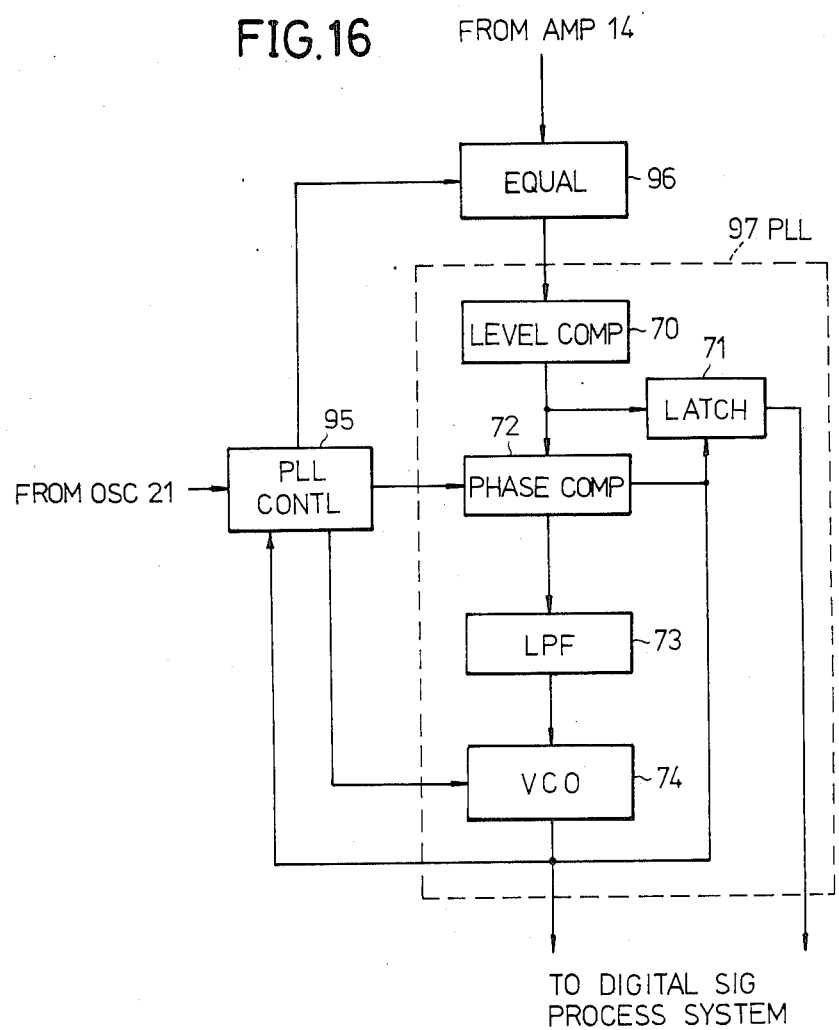

DIGITAL SIGNAL RECORDING AND REPRODUCING APPARATUS HAVING ROTARY MAGNETIC HEADS

BACKGROUND OF THE INVENTION

The present invention generally relates to digital signal recording and reproducing apparatuses, and more particularly to a digital signal recording and reproducing apparatus which records and reproduces a digital signal on and from a magnetic tape by use of rotary heads and comprises means for detecting a relative linear velocity between the rotary head and the magnetic tape.

A digital signal recording and reproducing apparatus for recording and reproducing a digitally modulated information signal such as a pulse code modulated (PCM) digital audio signal on and from a magnetic tape is conventionally known. At the time of the reproduction in such an apparatus, a reproduced signal is subjected to an equalization and a bit clock signal is then produced by a phase locked loop (PLL) circuit. This bit clock signal is used and demodulate the original digital signal from the reproduced signal. But the frequency characteristic of an equalizer circuit and the lock-in range of the PLL circuit are closely related to the recording bit rate (transmission rate) of the reproduced signal. For this reason, it is necessary to detect a relative linear velocity between the rotary head which rotates and the magnetic tape which is transported (hereinafter simply referred to as a relative linear velocity) and control the relative linear velocity constant based on the detection or variably control the relative linear velocity based on the detection so that the transmission rate of the reproduced signal becomes constant. In addition, during a high-speed reproduction mode in which the recorded digital signal is reproduced from the magnetic tape which is transported at a speed higher than that at the time of the recording so as to search for a predetermined recorded signal in a short time, for example, the above described detection of the relative linear velocity and control are also necessary because the magnetic tape is transported in a direction (forward direction) identical to that at the time of the recording or in a direction (reverse direction) opposite to that at the time of the recording.

Accordingly, the conventional apparatus employs a rotary encoder which makes contact with the magnetic tape which is transported. The rotary encoder generates pulses dependent on the rotation frequency thereof, and the conventional apparatus detects the tape transport speed by counting the pulses from the rotary encoder. However, this system used in the conventional apparatus suffer disadvantages in that (I) it is necessary to accurately control the precision of parts of the apparatus, (II) the rotary encoder easily slips when the magnetic tape is transported at a high speed, (III) an error is generated in the detected tape transport speed with age due to frictional wear of bearings and the like, and (IV) the performance of the tape transport system is affected by the rotary encoder since the rotary encoder is added to the tape transport system.

It is possible to conceive a system in which a special signal for speed detection is recorded on and reproduced from a track which is formed in the longitudinal direction of the magnetic tape in addition to the oblique tracks formed by the rotary heads. However, it becomes necessary to provide a stationary head exclusively for recording and reproducing the special signal and to provide recording and reproducing circuits for the special signal, and there are problems in that the number of parts required in the apparatus becomes large and the apparatus becomes expensive.

Furthermore, the system used in the conventional apparatus and the conceivable system described above both detect the tape transport speed and not the relative linear velocity. For this reason, a system for detecting the relative linear velocity was previously proposed in a Japanese Laid-Open patent application No. 60-231952, for example. According to the previously proposed system, the tape transport speed is calculated based on the number of tracks traversed by the rotary head during one revolution of the rotary head, and the rotational speed of a reel driving motor is controlled depending on the calculated tape transport speed so as to maintain the relative linear velocity constant.

When reproducing pre-recorded signals from the magnetic tape by two rotary heads having gaps of mutually different azimuth angles, the level of a reproduced RF signal reproduced from a track is large in the case where the gap of the scanning rotary head has the same azimuth angle as that of the rotary head which recorded the track, and the level of a reproduced RF signal reproduced from a track is small in the case where the gap of the scanning rotary head has a azimuth angle different from that of the rotary head which recorded the track. In other words, due to the azimuth loss effect, the level of the reproduced RF signal reproduced from a track greatly differs depending on whether the gap of the scanning rotary head has the same azimuth angle as that of the rotary head which recorded the track or has an azimuth angle different from that of the rotary head which recorded the track. Therefore, the number of tracks traversed by the rotary head can be counted by detecting the change in the envelope of the reproduced RF signal, and the relative linear velocity can be detected based on the counted value.

However, the envelope itself of the reproduced RF signal easily deviates when the magnetic tape is transported at the high speed, and the output level deviates due to the deviation in the tape transport speed. Hence, from the practical point of view, it is extremely difficult and delicate to set a threshold value for detecting the change in the envelope of the reproduced RF signal and for wave-shaping for the purpose of counting the number of tracks traversed by the rotary head.

SUMMARY OF THE INVENTION

Accordingly, it is a general object of the present invention to provide a novel and useful digital signal recording and reproducing apparatus in which the problems described heretofore are eliminated.

Another and more specific object of the present invention is to provide a digital signal recording and reproducing apparatus comprising rotary magnetic heads for recording and reproducing digital signals on and from a magnetic tape, where the digital signals include a digitally modulated information signal and a specific signal which is in a frequency region different from that of the digitally modulated information signal, frequency selecting means for frequency-selecting the specific signal from the reproduced digital signals from the rotary magnetic heads, measuring means for measuring a period of the specific signal frequency-selected in the frequency selecting means, and detecting means including means for calculating a rate of change of a transmission rate of the reproduced digital signals from the measured period of the specific signal and means for detecting a relative linear velocity between the rotary magnetic head and the magnetic tape. Accordingly to the apparatus of the present invention, it is possible to detect the relative linear velocity between the rotary magnetic head and the magnetic tape, because the period of the specific signal such as a pilot signal having a frequency greatly different from those of other signals reproduced from the magnetic tape is measured and the rate of change of the transmission rate of the reproduced digital signals is calculated from the measured value. Further, since the period of the specific signal is measured by counting clock pulses, the relative linear velocity can be accurately detected without the problem of setting an appropriate threshold value as in the case of the conventional apparatus which detects the change in the envelope of the reproduced RF signal. Furthermore, there is no need to provide a track on the magnetic tape for recording and reproducing a special signal exclusively for speed detection nor a head exclusively for recording and reproducing the special signal, and the recordable region of the magnetic tape can be effectively utilized. The apparatus according to the present invention is inexpensive because there is no need to provide an additional head or recording and reproducing circuits for the special signal.

Still another object of the present invention is to provide a digital signal recording and reproducing apparatus comprising rotary magnetic heads for recording and reproducing digital signals on and from a magnetic tape, where the digital signals include a digitally modulated information signal and a specific signal which is in a frequency region different from that of the digitally modulated information signal, frequency selecting means for frequency-selecting the specific signal from the reproduced digital signals from the rotary magnetic heads, measuring means for measuring a period of the specific signal frequency-selected in the frequency selecting means, holding means for holding a value measured in the measuring means, means for comparing the held value in the holding means with a calculated target value and for generating a control signal having a duty cycle dependent on the compared result, and control means for controlling a reel driving motor responsive to the control signal. According to the apparatus of the present invention, the time required for a search may be minimized and the accuracy with which a target position on the magnetic tape is reached is improved, because the rotational speed of the reel driving motor is controllable in a plurality of stages. Moreover, only one control signal having a varied duty cycle is required to control a driving circuit which drives the reel driving motor, and the means for generating the control signal can be realized by a simple logic circuit suited for production in the form of an integrated circuit.

A further object of the present invention is to provide a novel and useful digital signal recording and reproducing apparatus comprising rotary magnetic heads for recording and reproducing digital signals on and from a magnetic tape, where the digital signals include a digitally modulated information signal and a specific signal which is in a frequency region different from that of the digitally modulated information signal, frequency selecting means for frequency-selecting the specific signal from the reproduced digital signals from the rotary magnetic heads, measuring means for measuring a period of the specific signal frequency-selected in the frequency selecting means, holding means for holding a value measured in the measuring means, signal generating means for generating a signal having a period dependent on the value held in the holding means, and control means for comparing the period of the signal generated by the signal generating means and a period of an output clock signal of a phase locked loop (PLL) circuit so that a ratio of the two periods becomes a constant ratio, where the PLL circuit supplies to a digital signal processing system of the apparatus the clock signal and the digitally modulated information signal obtained from the reproduced signals from the rotary magnetic heads. According to the apparatus of the present invention, it is possible to constantly control the PLL circuit even during a time period in which no reproduced specific signal is obtained, because the measured value is held until the next measured value is obtained. In addition, it is possible to considerably shorten the time it takes for the PLL circuit to lick-in when the next reproduced signal is obtained. The PLL circuit can be stably controlled, and the digital signals can be reproduced stably even during a high-speed reproduction mode.

Other objects and further features of the present invention will be apparent from the following detailed description when read in conjunction with the accompanying drawings.

BRIEF DESCRIPTION OF THE DRAWINGS

FIGS. 4(A) through 4(C) are timing charts for explaining the operation of the block system shown in FIG. 1;

FIG. 5 is a circuit diagram showing an embodiment of a counted value selecting circuit within the block system shown in FIG. 1;

FIG. 9 is a system circuit diagram showing an embodiment of a phase locked loop circuit within the block system shown in FIG. 1;

FIGS. 10A and 10B are flow charts for explaining an embodiment of the operation of a system controller within the block system shown in FIG. 1;

FIG. 15 is a system block diagram showing a fourth embodiment of the digital signal recording and reproducing apparatus according to the present invention; and FIG. 16 is a system circuit diagram showing an embodiment of a phase locked loop circuit within the block system shown in FIG. 15.

DETAILED DESCRIPTION

Figure 1:
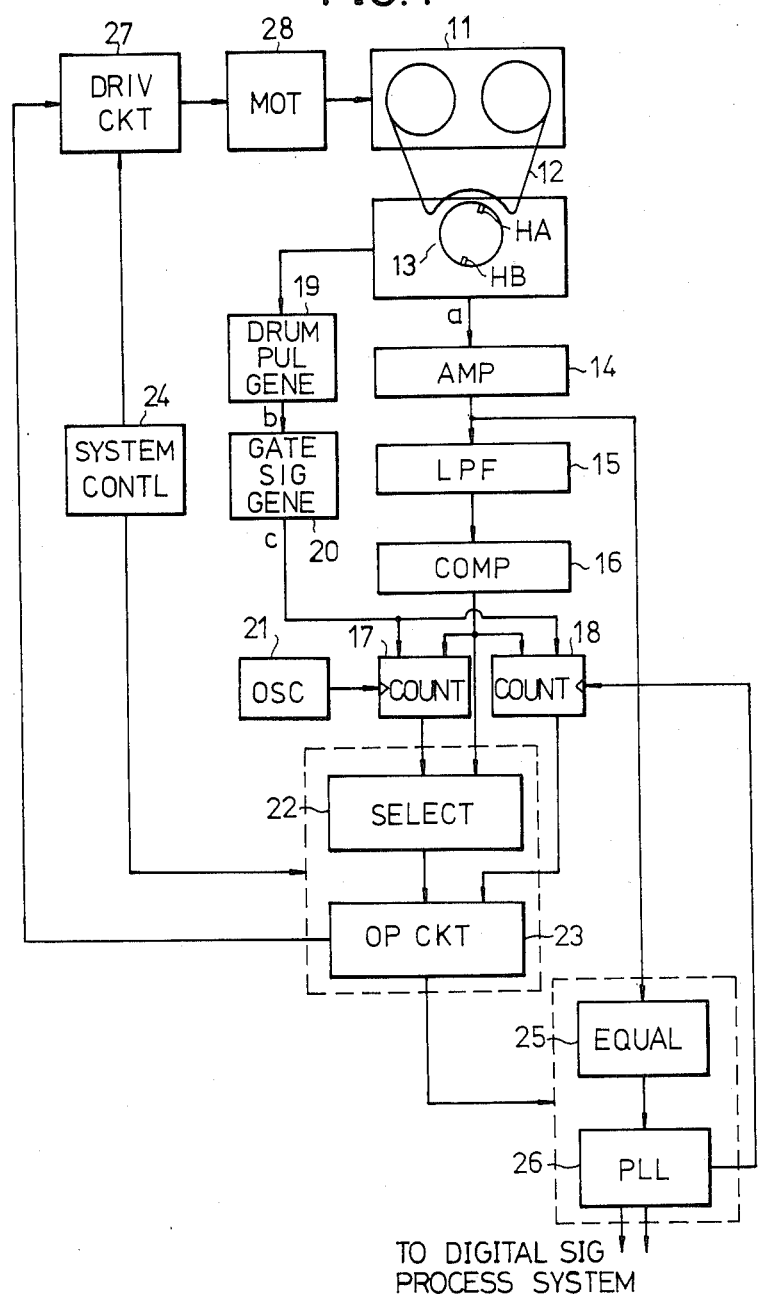
FIG. 1 is a system block diagram showing a first embodiment of the digital signal recording and reproducing apparatus according to the present invention.
Figure 2:
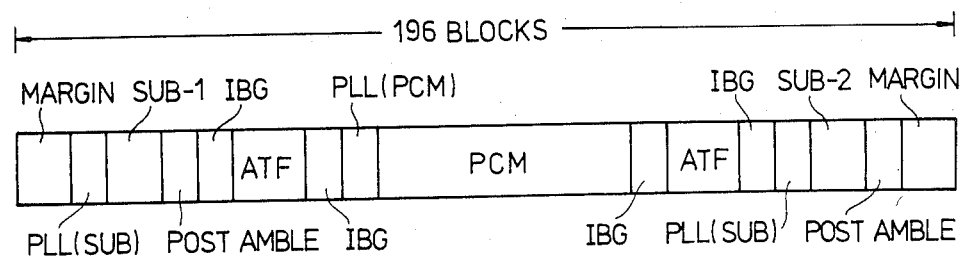
FIG. 2 schematically shows a signal format of signals recorded on one track of a magnetic tape.
Figure 3:
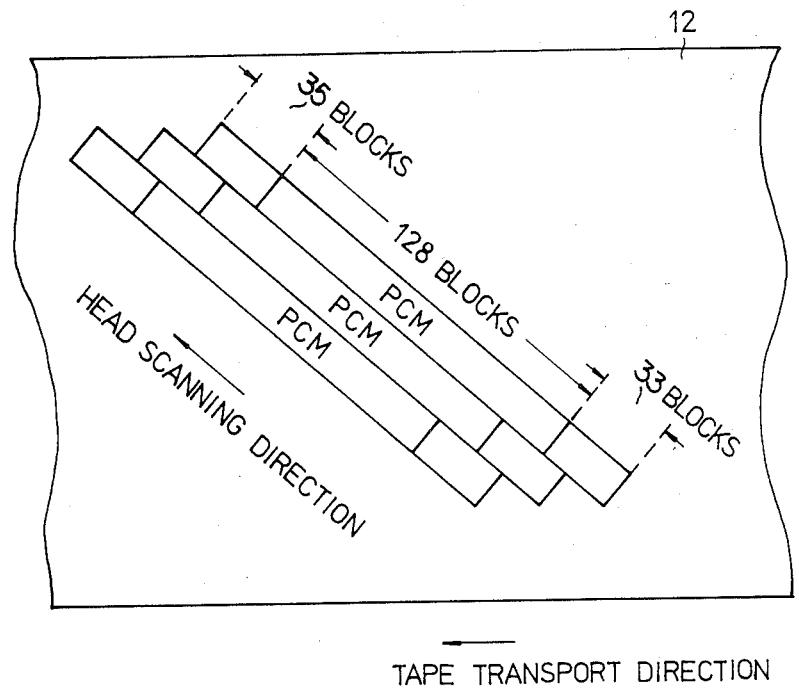
FIG. 3 shows a track pattern formed on the magnetic tape.

FIG. 1 shows the first embodiment of the present invention. During recording and reproduction modes, a magnetic tape 12 which is drawn out from a cassette 11 is wrapped obliquely around the peripheral surface of a head drum 13 for a predetermined angular range (for example, 90°). Two rotary magnetic heads HA and HB having gaps of mutually different azimuth angles alternately scan tracks which are formed obliquely to a longitudinal direction of the tape 12. For example, signals amounting to 196 blocks are recorded on one oblique track as shown in FIG. 2, where one block consists of 288 bits, for example. A digital audio signal having a sampling frequency of 48 kHz and a quantization number of sixteen bits, for example, is recorded together with parities, synchronizing bits and the like at the central portion (digital audio signal recording region) of the track in 128 blocks as shown in FIG. 3. Codes such as margin codes MARGIN, subcodes SUB-1 and SUB-2, automatic tracking codes ATF and the like shown in FIG. 2 are recorded in remaining code recording regions respectively amounting to 68 blocks before and after the digital audio signal recording region.

A transmission frequency $f_{ch}$ is set to 9.408 MHz, for example, and the signals recorded on each track have a frequency range from $f_{ch}/2$ to $f_{ch}/8$ except for the automatic tracking code ATF. The automatic tracking code ATF comprises first and second synchronizing signals, an erase signal and a pilot signal. The frequencies of the first and second synchronizing signals are respectively set to $f_{ch}/18$ and $f_{ch}/12$, the frequency of the erase signal is set to $f_{ch}/6$, and the frequency of the pilot signal is set to $f_{ch}/72$. The low-frequency signals thus having relatively small azimuth loss effects are recorded in an ATF region in the code recording region. Out of these low-frequency signals, the pilot signal in particular has an extremely low frequency and its azimuth loss is even less, and the pilot signal can practically be reproduced by either one of the heads $H_A$ and $H_B$ having gaps of mutually different azimuth angles. The following Table 1 shows the frequency, rotating angle of the head during the recording, number of blocks and period for each of the codes recorded on one track shown in FIG. 2.

TABLE 1

| Code | Frequency | Angle (deg) | Blocks | Period (μsec) |
| --- | --- | --- | --- | --- |
| MARGIN | $f_{ch}/2$ | 5.051 | 11 | 420.9 |
| PLL (SUB) | $f_{ch}/2$ | 0.918 | 2 | 76.5 |
| SUB-1 | | 3.673 | 8 | 306.1 |
| POST AMBLE | $f_{ch}/2$ | 0.459 | 1 | 38.3 |
| IBG | $f_{ch}/6$ | 1.378 | 3 | 114.8 |
| ATF | | 2.296 | 5 | 191.3 |
| IBG | $f_{ch}/6$ | 1.378 | 3 | 114.8 |
| PLL (PCM) | $f_{ch}/2$ | 0.918 | 2 | 76.5 |
| PCM | | 58.776 | 128 | 4898.0 |
| IBG | $f_{ch}/6$ | 1.378 | 3 | 114.8 |
| ATF | | 2.296 | 5 | 191.3 |
| IBG | $f_{ch}/6$ | 1.378 | 3 | 114.8 |
| PLL (SUB) | $f_{ch}/2$ | 0.918 | 2 | 76.5 |
| SUB-2 | | 3.673 | 8 | 306.1 |
| POST AMBLE | $f_{ch}/2$ | 0.459 | 1 | 38.3 |

TABLE 1-continued

| Code | Frequency | Angle (deg) | Blocks | Period (μsec) |
| --- | --- | --- | --- | --- |
| MARGIN | $f_{ch}/2$ | 5.051 | 11 | 420.9 |
| TOTAL | | 90.000 | 196 | 7500.0 |

On the other hand, in the case where the rotation frequency of the head drum 13 during the reproduction mode is maintained the same as that at the time of the recording and the tape transport speed during the reproduction mode is set differently from that at the time of the recording, a normalized value $r_B$ of the transmission rate during the reproduction mode with the different tape transport speed can be described by the following equation (1) when the tape transport speed at the time of the recording is assumed to be sufficiently small compared to the linear speed (peripheral speed) of the rotary head and the azimuth angle is neglected. In the equation (1), $r_B$ is the transmission rate during the reproduction mode with the different tape transport speed normalized by the transmission rate during the normal reproduction mode, N denotes the speed ratio of the present tape transport speed with respect to the tape transport speed durinng the normal reproduction mode, $V_{NP}$ denotes the tape transport speed during the normal reproduction mode, and θ denotes the tracking angle.

$$r_B \approx (V_H + N \cdot V_{NP} \cdot \cos\theta)/V_H \quad (1)$$
$$= 1 + (N \cdot V_{NP})/V_H \cdot \cos\theta$$

In the equation (1), the speed ratio N takes a negative value when the tape 12 is transported in the forward direction and takes a positive value when the tape 12 is transported in the reverse direction.

When it is assumed that the speed ratio is 200 (N=±200), $V_{NP}$ is 8.15 mm/sec, $V_H$ is 3.133 m/sec and θ is 6°22'59", the normalized value $r_B$ calculated from the equation (1) is approximately 1±0.52. As described before, the pilot signal has the lowest frequency out of the signals recorded within the recording region on the magnetic tape, and the pilot signal frequency is ¼ the frequency of the first synchronizing signal which has the next lowest frequency. For this reason, when the speed ratio is in the order of 200 or less, it is possible to discriminate the pilot signal from the signals reproduced from the magnetic tape.

In the present embodiment, the rotation frequency of the head drum 13 during the high-speed reproduction mode is maintained the same as that at the time of the recording (for example, 2000 rpm). A reproduced signal a shown in FIG. 4(A) is obtained from the two heads HA and HB which have an angular separation of 180° on a rotational plane of the head drum 13 and alternately scan the tape 12. The reproduced signal a is passed through a head amplifier 14 and is supplied to a lowpass filter 15 which passes only the low-frequency signals. An output signal of the lowpass filter 15 is converted into a square wave signal in a comparator 16, and this square wave signal is supplied to counters 17 and 18 as a reset signal. The square wave signal has a period identical to the period of the pilot signal.

On the other hand, a drum pulse signal b shown in FIG. 4(B) having a period dependent on the rotational speed of the head drum 13 is generated from a drum pulse generator 19 and is supplied to an ATF gate signal generator 20. When the rotational speed of the head drum 13 is constant, the ATF region is reproduced with a constant timing. Thus, the ATF gate signal generator 20 generates an ATF gate signal c shown in FIG. 4(C) which generally indicates that the region is the ATF region, and this ATF gate signal c is supplied to the counters 17 and 18 as a disable signal. Accordingly, the counters 17 and 18 carry out counting operations only during a low-level period of the disable signal (ATF gate signal) c, and the pilot signal can be detected with a high reliability with the ATF region.

The reproduced signal a and the drum pulse signal b may include inconsistencies on the time base (jitter) due to the error in the mounting positions of the sensor (not shown) for generating the drum pulse and the mounting positions of the heads HA and HB. However, such inconsistencies can be sufficiently absorbed by setting the pulse width of the ATF gate signal c to fifteen blocks, for example, although the ATF code is actually five blocks.

Clock pulses having the frequency $f_{ch}$ (9.408 MHz in the present embodiment) is generated from a crystal oscillator 21, and the counter 17 counts the clock pulses only during the low-level period of the disable signal c until the counter 17 is reset by the reset signal from the comparator 16. During the normal reproduction mode, a counted value $N_P$ in the counter 17 in one period of the reproduced pilot pilot signal is "72" when the clock pulses are counted. However, during the high-speed reproduction mode, the normalized value $r_B$ for the speed ratio of up to 200 can be described by the following relation (2) when the tape 12 is transported in the forward direction and by the following relation (3) when the tape 12 is transported in the reverse direction.

$$1 - 0.6 \leq r_B \leq 1 \quad (2)$$

$$1 \leq r_B \leq 1 + 0.6 \quad (3)$$

Hence, a counted value $N_S$ in the counter 17 in one period of the reproduced pilot signal during the high-speed reproduction mode can be described by the following relation (4) when the tape 12 is transported in the forward direction and by the following relation (5) when the tape 12 is transported in the reverse direction.

$$72 \leq N_S \leq 180 (=72/0.4) \quad (4)$$

$$45(=72/1.6) \leq N_S \leq 72 \quad (5)$$

A counted value selecting circuit 22 is supplied with the reset signal from the comparator 16 and the counted value $N_S$ from the counter 17, and discriminates that the reproduced signal is the pilot signal when the period of the reproduced signal satisfies the counted value $N_S$ of the relation (4) or (5). The selecting circuit 22 supplies the counted value $N_S$ to an operation circuit 23 when the relation (4) or (5) is satisfied, but discriminates that the reproduced signal having a period which does not satisfy the counted value $N_S$ of the relation (4) nor (5) is not the pilot signal and blocks the supply of the counted value $N_S$ to the operation circuit 23. The reliability with which the pilot signal is detected can be improved by controlling the selecting circuit 22 responsive to an output control signal of a system controller 24 indicative of the tape transport direction, so that the relation (4) is used to discriminate the pilot signal during the forward high-speed reproduction mode in which he tape 12 is transported in the forward direction and the relation (5) is used to discriminate the pilot signal during the reverse high-speed reproduction mode in which the tape 12 is transported in the reverse direction.

FIG. 5 shows an embodiment of the counted value selecting circuit 22. The selecting circuit 22 generally comprises decoders 30a, 30b, 31a and 31b, selectors 32 and 33, latch circuits 34 and 35, a NOR circuit 36 and a gate circuit 37. During the high-speed reproduction mode, the counted value $N_S$ from the the counter 17 is supplied to the decoders 30a, 30b, 31a and 31b and to the gate circuit 37. The decoders 30a and 30b respectively produce a low-level signal when the counted value $N_S$ reaches the minimum and the maximum of the range defined by the relation (4). The decoders 31a and 31b respectively produce a low-level signal when the counted value $N_S$ reaches the minimum and the maximum of the range defined by the relation (5). Output signals of the decoders 30a and 31a are supplied to the selector 32, and output signals of the decoders 30b and 31b are supplied to the selector 33. The control signal from the system controller 24 is applied to a terminal 38, and this control signal controls the selectors 32 and 33 to pass the output signals of the decoders 30a and 30b when the tape 12 is transported in the forward direction and to pass the output signals of the decoders 31a and 31b when the tape 12 is transported in the reverse direction. Output signals of the selectros 32 and 33 are supplied to the respective latch circuits 34 and 35 and are latched responsive to the output reset signal of the comparator 16 obtained via a terminal 39. Q-output and Q-output of the respective latch circuits 34 and 35 are supplied to the NOR circuit 36, and an output signal of the NOR circuit 36 is supplied to the gate circuit 37. The gate circuit 37 supplies the counted value $N_S$ to the operation circuit 23 only during a high-level period of the output signal of the NOR circuit 36.

Figure 6:
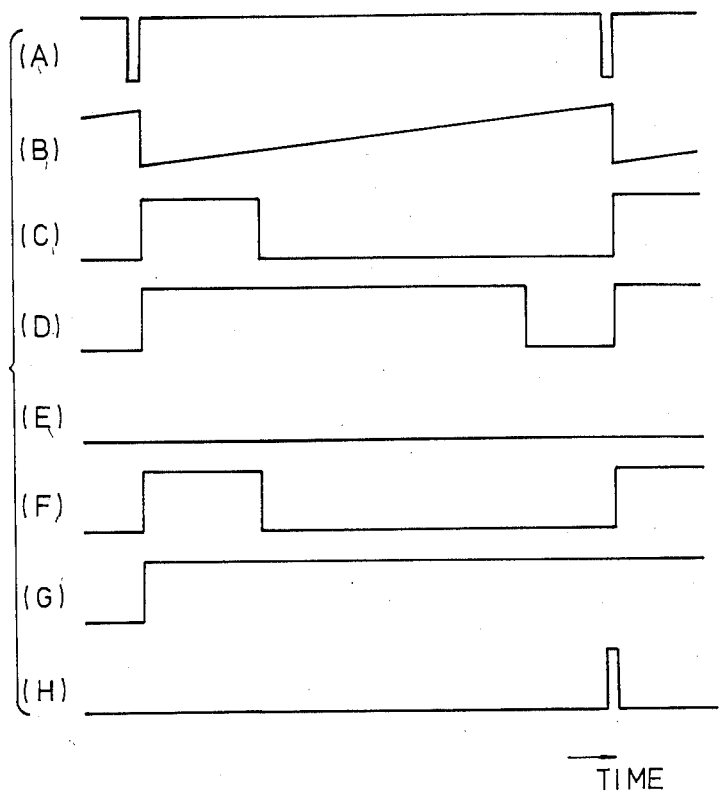
FIGS. 6(A) through 6(H) are timing charts for explaining the operation of the circuit shown in FIG. 5.

FIGS. 6(A) through 6(H) are timing charts for explaining the operating timings of the selecting circuit 22 shown in FIG. 5. FIGS. 6(A) and 6(B) respectively show the reset signal applied to the terminal 39 and the counted value $N_S$ from the counter 17. When the output signals shown in FIGS. 6(C) and 6(D) are obtained from the selectors 32 and 33, the output signal of the NOR circuit 36 has a low level at the end of one period of the pilot signal as shown in FIG. 6(E), and the supply of the counted value $N_S$ to the operation circuit 23 is blocked in this case. However, when the output signals shown in FIGS. 6(F) and 6(G) are obtained from the selectors 32 and 33, the output signal of the NOR circuit 36 has a high level at the end of one period of the pilot signal as shown in FIG. 6(H), and the counted value $N_S$ is supplied to the operation circuit 23 because the reproduced signal is discriminated as being the pilot signal.

On the other hand, the counter 18 is supplied with output pulses of a phase locked loop (PLL) circuit 26 which will be described later, and counts the pulses during the low-level period of the disable signal obtained from the ATF gate signal generator 20 until the counter 18 is reset by the reset signal from the comparator 16. The output pulses of the PLL circuit 26 have the frequency $f_{ch}$ (9.408 MHz in the present embodiment) during the normal reproduction mode but the frequency changes during the high-speed reproduction mode depending on the relative linear velocity. The change in the frequency of the output pulses of the PLL circuit 26 during the high-speed reproduction mode is the same as the change in the transmission rate described before. Accordingly, the counted value in the counter 18 is "72" during the normal reproduction mode and is also "72∞" or a value extremely close to "72" during the high-speed reproduction mode while the PLL circuit 26 is locked-in. The counted value in the counter 18 is supplied to the operation circuit 23 as a signal indicative of whether or not the PLL circuit 26 is operating normally.

The operation circuit 23 calculates the normalized value $r_B$ from the following equation (6) by use of the counted value $N_S$ which is obtained from the selecting circuit 22 and the counted value $N_P$ ($=72$) which is known.

$$r_B = N_P/N_S \qquad (6)$$

In other words, the operation circuit 23 calculates the tape transport speed. The operation circuit 23 variably controls a motor driving circuit 27 which supplies a driving voltage to a reel driving motor 28, so that the normalized value $r_B$ is within the range defined by the relation (2) or (3), or so that the speed ratio N obtained by substituting the normalized value $r_B$ into the equation (1) becomes equal to a predetermined value (200 in this case). Therefore, the tape transport speed in the high-speed reproduction mode is controlled and it is possible to prevent the tape transport speed from increasing out of control.

The operation circuit 23 also controls the frequency characteristic of an equalizer circuit 25 depending on the normalized value $r_B$ during the high-speed reproduction mode, and switches the lock-in range of the PLL circuit 26 by known means. The equalizer circuit 25 subjects the reproduced signal from the head amplifier 14 to an equalization. The equalizer circuit 25 usually comprises delay lines, and in the case where charge coupled devices (CCDs) are used for the delay lines, the delay time is determined by the clock pulse frequency (sampling period) and the number of stages of the CCDs, as is well known. Hence, in this case, depending on the normalized value $r_B$ calculated in the operation circuit 23, the sampling period may be controlled responsive to an output oscillation frequency of a voltage controlled oscillator (VCO) within the PLL circuit 26 the operation of which is switched by the normalized value $r_B$.

Figure 7:
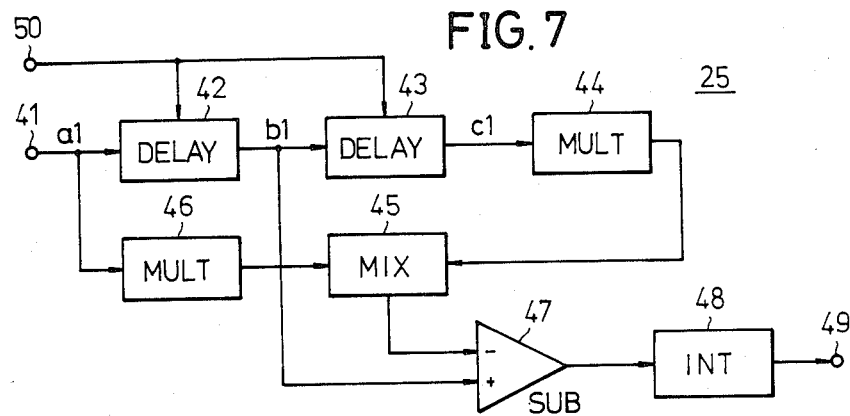
FIG. 7 is a system circuit diagram showing an embodiment of an equalizer circuit within the block system shown in FIG. 1.

FIG. 7 shows an embodiment of the equalizer circuit 25. The output signal a1 of the head amplifier 14 is applied to a terminal 41 and is supplied to a coefficient multiplier 44 via delay circuits 42 and 43 which respectively produce signals b1 and c1. The multiplier 44 multiplies a coefficient A1 to an incoming signal, and an output signal of the multiplier 44 is supplied to a mixer 45. On the other hand, a coefficient multiplier 46 multiplies a coefficient A2 to the signal a1 and supplies an output signal to the mixer 45. The signals from the multipliers 44 and 46 are added in the mixer 45 and is supplied to a subtracting circuit 47. The subtracting circuit 47 subtracts the output signal of the mixer 45 from the output signal b1 of the delay circuit 42. An output signal of the subtracting circuit 47 is integrated in an integrating circuit 48 and is produced via a terminal 49 as the output signal of the equalizer circuit 25. The output signal of the operation circuit 23 is applied to a terminal 50 and controls the delay times of the delay circuits 42 and 43.

The equalizer circuit 25 shown in FIG. 7 theoretically has a frequency characteristics described by $G(j\omega) = 1 - 2A \cos \omega T$, when it is assumed that $A1 = A2 = A$ and the delay circuits 42 and 43 have a delay time T. The delay time T and the coefficients A1 and A2 can be appropriately adjusted to obtain a desired frequency characteristic.

Figure 8:
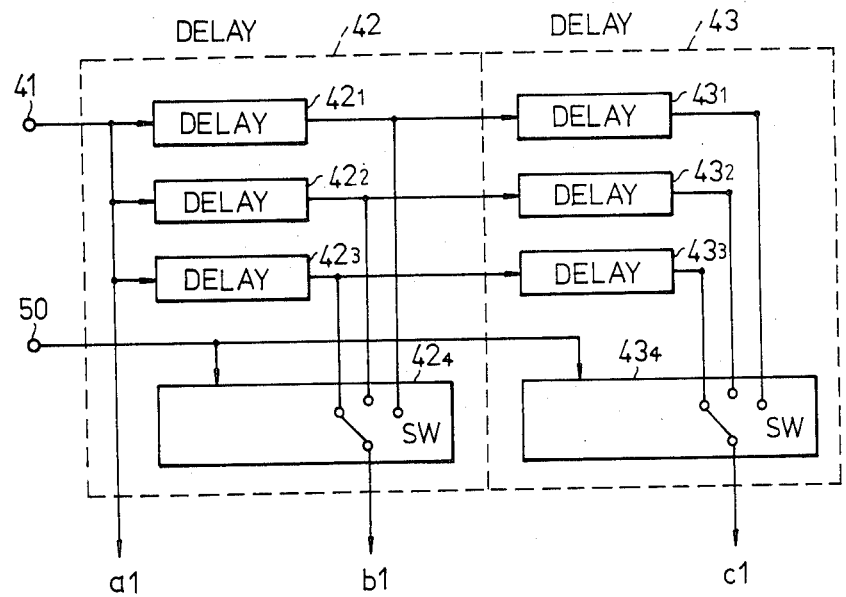
FIG. 8 is a system circuit diagram showing an embodiment of a delay part of the equalizer circuit shown in FIG. 7.

FIG. 8 shows an embodiment of the delay part of the equalizer circuit 25 shown in FIG. 7. The delay circuit 42 comprises delay elements $42_1$, $42_2$ and $42_3$ having mutually different delay times, and an analog switch $43_4$. The delay element $42_1$ through $42_3$ are supplied with the signal a1 and output signals thereof are supplied to respective fixed contacts of the switch $42_4$. A moving contact of the switch $42_4$ is switched over and connected to one of the three fixed contacts responsive to the signal from the terminal 50, so that the signal a1 is delayed by an appropriate delay time and the signal b1 is outputted from the switch $42_4$.

The delay circuit 43 comprises delay elements $43_1$, $43_2$ and $43_3$ having mutually different delay times, and an analog switch $43_4$. The delay elements $43_1$ through $43_3$ are supplied with the output signals of the corresponding delay elements $42_1$ through $42_3$ of the delay circuit 42, and output signals of the delay elements $43_1$ through $43_3$ are applied to respective fixed contacts of the switch $43_4$. A moving contact of the switch $43_4$ is switched over and connected to one of the three fixed contacts responsive to the signal from the terminal 50, so that the signal c1 is outputted from the swtich $43_4$.

An output signal of the equalizer circuit 25 is supplied to a level comparator 70 within the PLL circuit 26 shown in FIG. 9. The level comparator 70 compares the output signal level of the equalizer circuit 25 with an average D.C. level and produces a square wave signal indicative of the compared result. This square wave signal is supplied to a data latch circuit 71 and to a phase comparator 72. The phase comparator 72 produces an error voltage dependent on a phase error between the square wave signal from the level comparator 70 and an output signal of a VCO 74. The error voltage is supplied to the VCO 74 via a lowpass filter 73 as a control voltage for variable controlling an output oscillation frequency of the VCO 74. The output signal of the VCO 74 is also supplied to the counter 18, a digital signal processing system (not shown) of the recording and reproducing apparatus, and to the data latch circuit 71 as a latch pulse signal. The data latch circuit 71 latches the reproduced signal responsive to the output signal of the VCO 74, and the latched signal is supplied to the digital signal processing system as reproduced digital data.

The lock-in frequency of the PLL circuit 26 is equal to the transmission frequency $f_{ch}$ (9.408 MHz) during the normal reproduction mode, but is equal to a transmission frequency proportional to the normalized value $r_B$ during the high-speed reproduction mode. Especially during the high-speed reproduction mode in which the lock-in range of the PLL circuit 26 is set to a wide range, the PLL circuit 26 may erroneously lock-in to harmonics of the transmission frequency $f_{ch}$ and the PLL circuit 26 may erroneously lock-in when a frequency ratio between the input signal frequency of the PLL circuit 26 and the output signal frequency of the VCO 74 becomes a predetermined ratio. In such cases, the data cannot be entered correctly.

Accordingly, in the present embodiment, measures are taken so that the output signal frequency of the PLL circuit 26 (that is, the output signal frequency of the VCO 74) is the same during the the high-speed reproduction mode and the normal reproduction mode. By noting that the transmission frequency $f_{ch}$ is 72 times the reproduced pilot signal frequency, the output pulses of the VCO 74 are counted in the counter 18, and it is discriminated that the PLL circuit 26 is operating normally when the counted value in the counter 18 is equal to "72" or a value close to "72", while it is discriminated that the PLL circuit 26 is operating abnormally when the counted value in the counter 18 is greatly different from "72". In other words, in the present embodiment, the operation circuit 23 supplies to the VCO 74 within the PLL circuit 26 a control voltage which is in correspondence with the normalized value $r_B$, based on the counted value in the counter 17. Furthermore, the operation circuit 23 constantly checks the counted value in the counter 18. When the counted value in the counter 18 greatly deviates from "72", the operation circuit 23 supplies a control signal to the phase comparator 72 for a predetermined time and the output error voltage of the phase comparator 72 is forcibly set to a high level or a low level for the predetermined time, so as to correct the control voltage of the VCO 74 to a normal value.

When the operation mode is set to the high-speed reproduction mode, the system controller 24 supplies a signal to the driving circuit 27 for rotating the motor 28 at a high speed responsive to the output driving voltage of the driving circuit 27. In this case, in order to minimize the access time and improve the accuracy with which a target position on the magnetic tape is reached, it is desirable to control the tape transport speed (rotational speed of the motor 28) depending on the distance between the present position and the target position on the magnetic tape. However, it is also possible to control the tape transport speed by comparing a target tape transport speed and a detected tape transport speed and increase or decrease the rotational speed of the motor 28 based on the compared result.

Figure 10B:
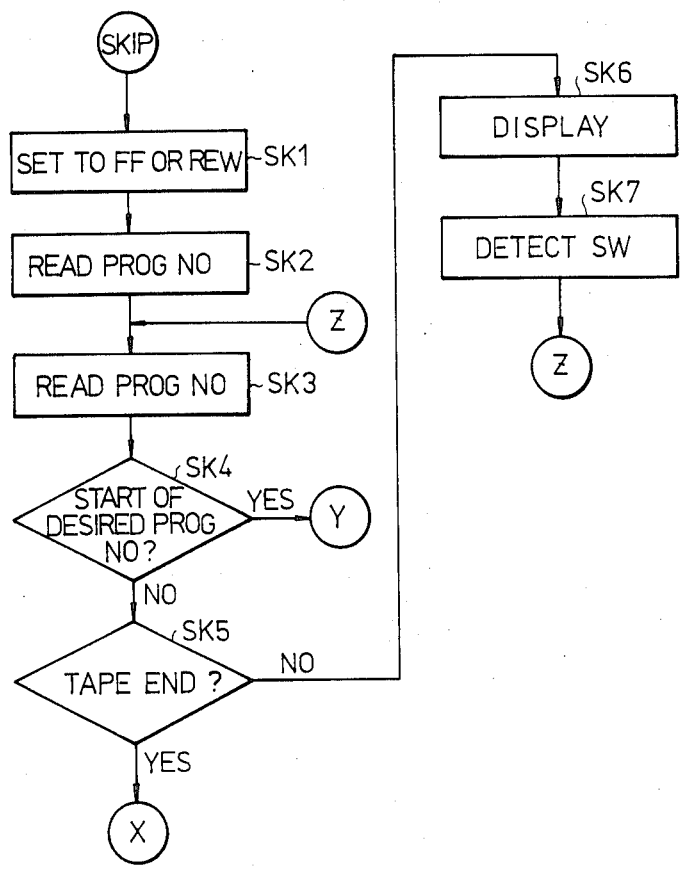

Next, description will be given with respect to an embodiment of the operation of the system controller 24 by referring to FIGS. 10A and 10B. It is assumed that a microcomputer is used for the system controller 24. In FIG. 10A, a step S1 carries out an initializing operation including the operation of turning the power source ON. A step S2 sets the operation mode of the recording and reproducing apparatus to a stop mode. A step S3 displays the present operation mode, the present program number and the like on an indicator (not shown). A step S4 discriminates whether or not the tape 12 is being transported. When the discrimination result in the step S4 is YES, a step S5 discriminates whether or not the end of the tape 12 is reached. When the discrimination result in the step S5 is YES, the operation returns to the step S2. On the other hand, the operation advances to a step S6 when the discrimination result in the step S4 or S5 is NO.

The step S6 discriminates whether or not any of switches (not shown) for setting the operation mode has been manipulated. When the discrimination result in the step S6 is NO, the operation returns to the step S3. On the other hand, when the discrimination result in the step S6 is YES, a step S7 discriminates whether or not the manipulated switch coincides with the switch for setting the operation mode to the present operation mode. The operation returns to the step S3 when the discrimination result in the step S7 is YES, and the operation advances to a step S8 when the discrimination result in the step S7 is NO. The step S8 and steps S9 through S15 respectively discriminate whether or not the manipulated switch coincides with the switch for setting the operation mode to a recording mode, a play (reproduction) mode, a forward skip mode, a reverse skip mode, a fast-forward mode, a rewind mode, a pause mode and a stop mode. The operation returns to the step S2 when the discrimination result in the step S15 is YES, and the operation returns to the step S3 when the discrimination result in the step S15 is NO.

The skip mode is an operation mode in which the playing of the piece of music presently being played is discontinued and the tape 12 is transported in the fast-forward or rewind mode to the start of a desired piece of music recorded immediately before or after the piece of music which was being played, so as to start playing the desired piece of music. Such a skip mode is possible because the tape 12 is recorded with various data such as the data for identifying the program number, the play time and the like, as is well known.

When the discrimination result in the step S8 is YES, a step S16 sets the recording and reproducing apparatus to the recording mode, and the operation is returned to the step S3. Similarly, when the discrimination result in the step S9 is YES, a step S17 sets the recording and reproducing apparatus to the play (reproduction) mode, and the operation is returned to the step S3.

A step S18 sets the operation mode to the fast-forward mode when the discrimination result in the step S12 is YES, a step S19 sets the operation mode to the rewind mode when the discrimination result in the step S13 is YES, and a step S20 sets the operation mode to the pause mode when the discrimination result in the step S14 is YES. The operation returns to the step S3 after each of the steps S18, S19 and S20.

On the other hand, when the discrimination result in the step S10 or S11 is YES, the operation advances to a skip routine shown in FIG. 10B. A step SK1 sets the operation mode to the fast-forward or rewind mode depending on whether the forward skip mode or the reverse slip mode is selected. A step SK2 reads the program number immediately after the operation mode is set to the skip mode. A step SK3 successively reads the program number as the reproduction progresses. A step SK4 discriminates whether or not the starting position of the desired program number immediately before or after the program number at the time when the skip mode was selected is reached depending on whether the forward skip mode or the reverse skip mode is selected. The operation advances to the step S17 shown in FIG. 10A when the discrimination result in the step SK4 is YES.

When the discrimination result in the step SK4 is NO, a step SK5 discriminates whether or not the end of the tape 12 is reached. The operation returns to the step S2 shown in FIG. 10A when the discrimination result in the step SK5 is YES. A step SK6 displays the program number, operation mode and the like on the indicator when the discrimination result in the step SK 5 is NO. A step SK7 carries out operations similar to those of the steps S6 through S15 shown in FIG. 10A, and the operation thereafter returns to the step SK3.

Figure 11:
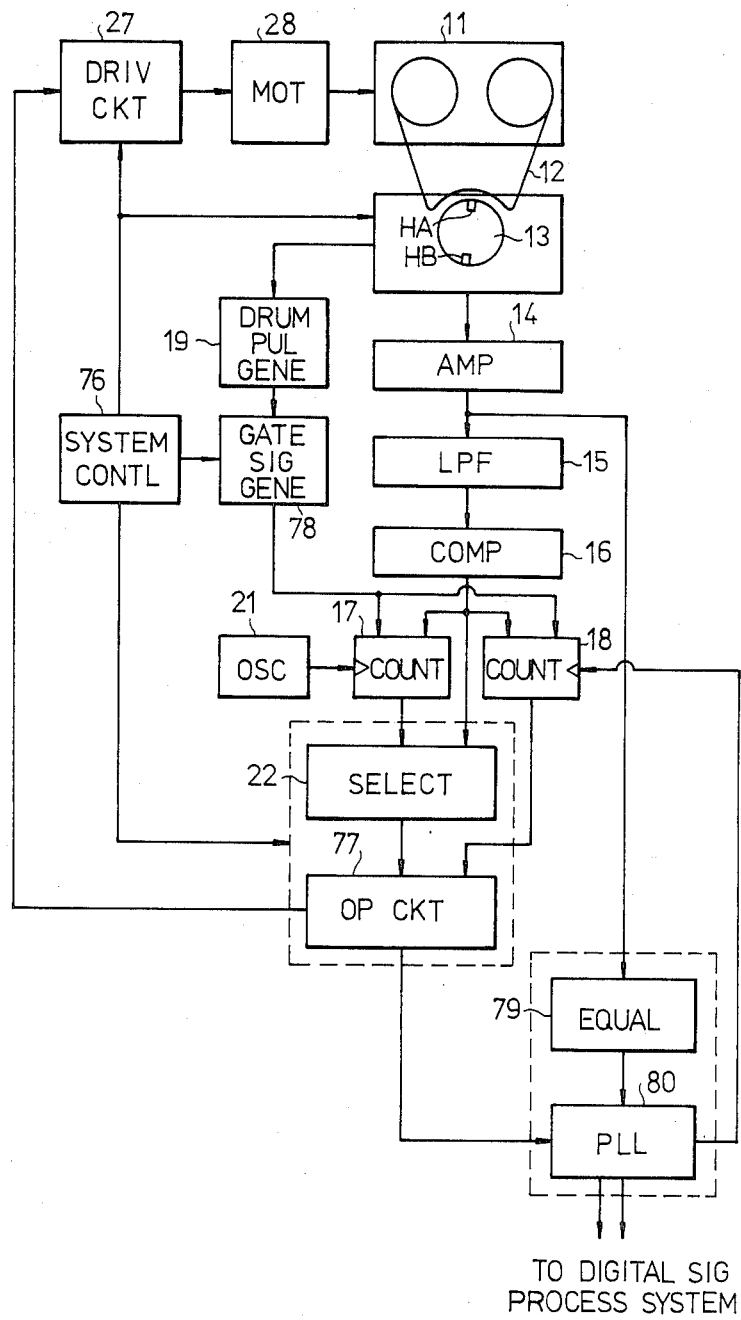
FIG. 11 is a system block diagram showing a second embodiment of the digital signal recording and reproducing apparatus according to the present invention.

Next, description will be given with respect to a second embodiment of the recording and reproducing apparatus according to the present invention, by referring to FIG. 11. In FIG. 11, those parts which are the same as those corresponding parts in FIG. 1 are designated by the same reference numerals, and description thereof will be omitted. In the present embodiment, the tape 12 is transported during the high-speed reproduction mode at a high speed in the order of 200 times the tape transport speed at the time of the recording, and furthermore, the transmission rate of the reproduced signal is controlled depending on the tape transport speed to be approximately the same as the transmission rate during the normal reproduction mode. The rotation frequency of a drum motor (not shown) which rotates the head drum 13 is variably controlled responsive to an output control signal of a system controller 76.

When it is assumed that the tape transport speed is sufficiently slow compared to the peripheral speed of the rotary head during the normal reproduction mode and the azimuth angle is neglected, a normalized value $r_H$ of the rotation frequency of the head duriang the high-speed reproduction mode for making the transmission rate of the reproduced signal approximately the same as that during the normal reproduction mode can be described by the following equation (7), where the $r_H$ is the rotation frequency of the head during the high-speed reproduction mode normalized by the rotation frequency of the head during the normal reproduction mode.

$$r_H \approx 1 - (N \cdot V_{NP} \cos \theta)/V_H \qquad (7)$$

In the equation (7), the speed ratio N takes a negative value when the tape 12 is transported in the forward direction and takes a positive value when the tape 12 is transported in the reverse direction. When it is assumed that the speed ratio is 200 (N=±200), $V_{NP}$ is 8.15 mm/sec, $V_H$ is 3.133 m/sec and $\theta$ is 6°22′59″, the normalized value $r_H$ calculated from the equation (7) is approximately 1±0.52.

In the present embodiment, during the forward high-speed reproduction mode with the speed ratio N=200, the system controller 76 first controls the driving circuit 27 so as to transport the tape 12 in the forward direction at an appropriate tape transport speed with the tape 21 in contact with the head drum 13, and the system controller 76 then controls the rotation frequency of the head drum 13 to approximately 1.52 times the rotation frequency at the time of the recording (or normal reproduction mode).

Next, an operation circuit 77 calculates the normalized value $r_B$ from the counted value $N_S$ (of the period of the reproduced pilot signal) obtained from the selecting circuit 22 as in the case of the first embodiment. In other words, the operation circuit 77 detects the relative linear velocity. The operation circuit 77 controls the driving circuit 27 so that the calculated normalized value $r_B$ coincides with that during the normal reproduction mode. As a result, the transmission rate of the reproduced signal is controlled to be the same as that during the normal reproduction mode, and the tape transport speed is controlled to approximately 200 times the tape transport speed at the time of the recording (or normal reproduction mode).

According to the present embodiment, the rotation frequency of the head drum 13 (that is, the rotation frequency of the head) is variably controlled depending on the speed ratio so that the relative linear velocity becomes the same as that at the time of the recording (or normal reproduction mode). For this reason, the relationship between the timing with which the ATF region is reproduced and the phase of the drum pulse signal becomes different depending on the speed ratio. However, by supplying to an ATF gate signal generator 78 an output signal of the system controller 76 dependent on the speed ratio, it is possible to generate in the ATF gate signal generator 78 an ATF gate signal which generally indicates the reproducing time period of the ATF region.

Since the transmission rate of the reproduced signal is constant, the frequency characteristic of an equalizer circuit 79 and the lock-in range of a PLL circuit 80 are fixed, and the reproduced digital data and clock signal are produced from the PLL circuit 80. When the PLL circuit 80 is carrying out an abnormal operation, a VCO without the PLL circit 80 is controlled by an output signal of the operation circuit 77 which is based on the counted value in the counter 18 so that the PLL circuit 80 carries out a normal operation and to lock-in to the transmission frequency $f_{ch}$. Circuits similar to those shown in FIGS. 7 through 9 may be used for the equalizer circuit 79 and the PLL circuit 80, and illustration and description thereof will be omitted.

In addition, according to the present embodiment, it is effective to control the tape transport speed in a plurality of stages so as to improve the accessibility.

Therefore, according to the first and second embodiments described heretofore, it is possible to detect the relative linear velocity between the rotary magnetic head and the magnetic tape, because the period of a specific signal such as the pilot signal having a frequency greatly different from those of the other signals reproduced from the magnetic tape is counted and the rate of change of the transmission rate of the reproduced signal is calculated from the counted value. Further, since the period of the specific signal is counted by counting clock pulses, the relative linear velocity can be accurately detected without the problem of setting an appropriate threshold value as in the case of the conventional apparatus which detects the change in the envelope of the reproduced RF signal. Furthermore, there is no need to provide a track on the magnetic tape for recording and reproducing a special signal exclusively for speed detection nor a head exclusively for recording and reproducing the special signal, and the recordable region of the magnetic tape can be effectively utilized. The apparatuses of the first and second embodiments are inexpensive because there is not need to provide an additional head or recording and reproducing circuits for the special signal.

Figure 12:
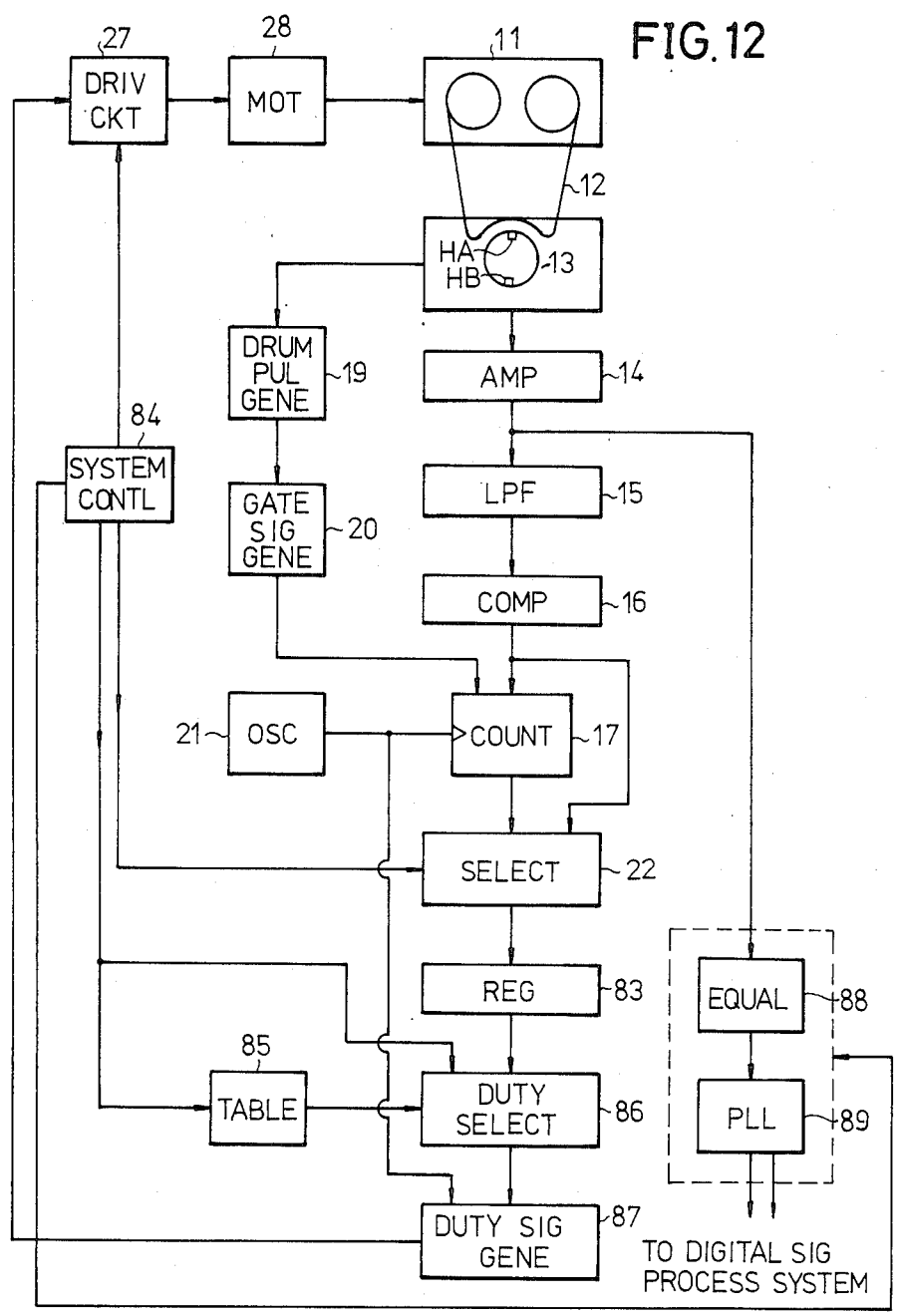
FIG. 12 is a system block diagram showing a third embodiment of the digital signal recording and reproducing apparatus according to the present invention.
Figure 13:
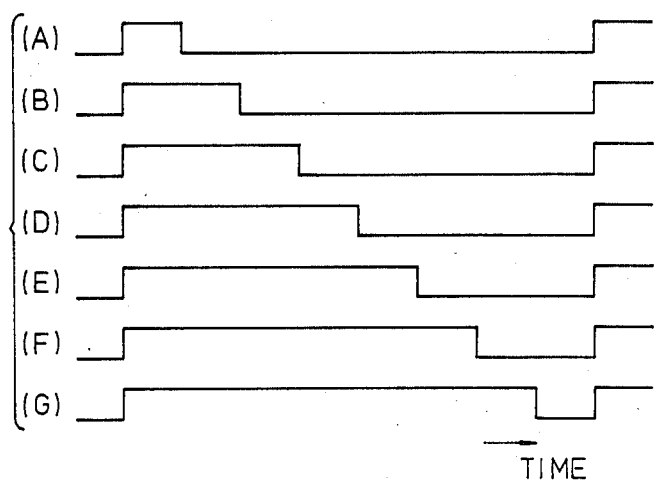
FIGS. 13(A) through 13(G) are timing charts for explaining the operation of the block system shown in FIG. 12.

FIG. 12 shows a third embodiment of the recording and reproducing apparatus according to the present invention. In FIG. 12, those parts which are the same as those corresponding parts in FIG. 1 are designated by the same reference numerals, and description thereof will be omitted. In the present embodiment, the rotation frequency of the head drum 13 during the high-speed reproduction mode is maintained the same as that at the time of the recording (for example, 2000 rpm).

The selecting circuit 22 discriminates that the reproduced signal having the period within the range of the counted value $N_S$ defined by the relation (4) or (5) is the pilot signal and supplies the counted value $N_S$ to a register 83. The register 83 holds the counted value $N_S$ until the counter 17 performs the next count.

It is possible to improve the reliability with which the pilot signal is detected by discriminating that the reproduced signal is the pilot signal only when the clock pulses with substantially the same phase are obtained several times (for example, four times), since ten clock pulses exist within one ATF region in the case of the pilot signal.

On the other hand, a look-up table 85 contains the counted values in one period of the reproduced pilot signal for various speed ratios. For example, the normalized value $r_B(150)$ for the forward high-speed reproduction mode with the speed ratio of 150 can be calculated as follows from the equation (1).

$$r_B(150) = 1 + (-150 \times 8.15 \times 10^{-3})/3.133 \times \cos(6°22'59'')$$
$$= 1.388$$

Accordingly, the counted value $N_C$ in one period of the pilot signal is $N_C=118$. Similarly, the counted value $N_C$ in one period of the pilot signal during the reverse high-speed reproduction with the speed ratio of 150 is $N_C=52$. The look-up table 85 is constituted by a read only memory (ROM) or a simple logic circuit in the case where the number of kinds of speed ratios is small.

The high-speed reproduction mode is used when carrying out a search to find a target position on the tape 12 such as the starting position of a piece of music. For example, the tape 12 is transported in the forward or reverse direction at a relatively high speed when the present position and the target position are separated by a large distance, the tape 12 is transported in the forward or reverse direction at a relatively slow speed when the present position and the target position are close to each other, and the tape 12 is stopped when the target position is reached. In order to improve the accuracy with which the tape 12 is stopped when the target position is reached, it is desirable to change the tape transport speed in several stages.

When changing the tape transport speed in several stages, a system controller 84 first sets the required speed ratio (for example, a speed ratio of 150 in the forward direction), looks up the look-up table 85 for the counted value in one period of the reproduced pilot signal for the required speed ratio, and supplies a target counted value $N_C$ read out from the look-up table 85 to a duty selecting circuit 86. On the other hand, the counted value $N_S$ held in the register 83 is also supplied to the duty selecting circuit 86.

The duty selecting circuit 86 produces a duty cycle value from the target counted value $N_C$ which is obtained from the look-up table 85 and the held counted value $N_S$ which is obtained from the register 83. The duty cycle value from the duty selecting circuit 86 is supplied to a variable duty signal generator 87 which generates a duty signal having a duty cycle thereof varied by the duty cycle value from the duty selecting circuit 86. This output duty signal of the variable duty signal generator 87 is supplied to the driving circuit 27. The duty selecting circuit 86 may be constituted by a simple logic circuit or a ROM, and the variable duty signal generator 87 may be constituted by a simple logic circuit which operates responsive to the duty cycle value and the clock pulses from the crystal oscillator 21.

The driving circuit 27 controls the motor 28 depending on the duty signal having the varied duty cycle. The period of the output duty signal of the variable duty signal generator 87 is set appropriately so that the duty signal can be easily processed in the subsequent stages. The duty cycle of the duty signal is set to 50% when the target counted value $N_C$ from the look-up table 85 is extremely close to or equal to the held counted value $N_S$ from the register 83. When the difference between the target counted value $N_C$ and the held counted value $N_S$ is large, the duty cycle of the duty signal is varied depending on the difference and the tape transporting direction.

The driving circuit 27 rotates the motor 28 in a direction dependent on the tape transport direction. An error voltage from a filter of the driving circuit 27 is added to the driving voltage so as to increase the rotation frequency of the motor 28 when the error voltage is a positive voltage regardless of the tape transporting direction and to decrease the rotation frequency of the motor 28 when the error voltage is a negative voltage regardless of the tape transporting direction. In other words, the rotation frequency of the motor 28 is increased when the duty cycle of the duty signal increases, and the rotation frequency of the motor 28 is decreased when the duty cycle of the duty signal decreases.

In this case, the duty cycle can be varied to one of seven kinds of duty cycles shown in FIGS. 13(A) through 17(G) depending on the difference which is obtained by subtracting the target counted value $N_C$ from the held counted value $N_S$. For example, when the tape 12 is transported in the reverse direction with the speed ratio of 150 and the target counted value $N_C=52$, the following Table 2 shows how the duty cycle may be selected in relation to the held counted value $N_S$, the difference ($N_S-N_C$) and the duty cycles shown in FIGS. 13(A) through 13(G).

TABLE 2

| $N_S$ | $N_S-N_C$ | Duty |
|---|---|---|
| 49 or less | −3 or less | FIG. 13(A) |
| 50 | −2 | FIG. 13(B) |
| 51 | −1 | FIG. 13(C) |
| 52 | 0 | FIG. 13(D) |
| 53 | +1 | FIG. 13(E) |
| 54 | +2 | FIG. 13(F) |
| 55 or over | +3 or over | FIG. 13(G) |

When the tape 12 is transported in the reverse direction, the tape transport speed becomes faster when the held counted value $N_S$ becomes smaller and becomes slower when the held counted value $N_S$ becomes larger. For this reason, the small duty cycle such as that shown in FIG. 13(A) is selected when the held counted value $N_S$ is smaller than the target counted value $N_C$ so as to decrease the tape transport speed and the large duty cycle such as that shown in FIG. 13(G) is selected when the held counted value $N_S$ is larger than the target counted value $N_C$ so as to increase the tape transport speed, and to control the duty cycle to 50%. The duty cycles are selected similarly for the case where the tape 12 is transported in the forward direction with the speed ratio of 25, and the speed ratio of 150 is used when the target position is far away from the present position and the speed ratio of 25 is used when the target position is close from the present position. The relation described heretofore is opposite for the case where the tape 12 is transported in the forward direction.

For example, when the tape 12 is transported in the forward direction with the speed ratio of 150 and the target counted value $N_C=118$, the following Table 3 shows how the duty cycle may be selected in relation to the held counted value $N_S$, the difference ($N_S-N_C$) and the duty cycles shown in FIGS. 13(A) through 13(G).

TABLE 3

| $N_S$ | $N_S-N_C$ | Duty |
|---|---|---|
| 106 or less | −12 or less | FIG. 13(G) |
| 107 to 110 | −8 to −11 | FIG. 13(F) |

TABLE 3-continued

| $N_S$ | $N_S-N_C$ | Duty |
|---|---|---|
| 111 to 114 | −4 to −7 | FIG. 13(E) |
| 115 to 121 | 0, ±3 | FIG. 13(D) |
| 122 to 125 | +4 to +7 | FIG. 13(C) |
| 126 to 129 | +8 to +11 | FIG. 13(B) |
| 130 or over | +12 or over | FIG. 13(A) |

Figure 14:
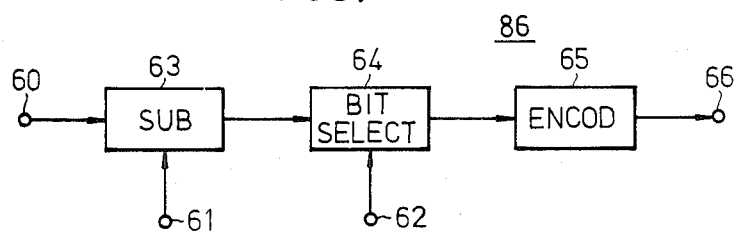
FIG. 14 is a system block diagram showing an embodiment of a duty selecting circuit shown in FIG. 12.

FIG. 14 shows an embodiment of the duty selecting circuit 86. The duty selected circuit 86 comprises a subtracting circuit 63, a bit selector 64 and an encoder 65. The subtracting circuit 63 subtracts the target counted value $N_C$ obtained from the look-up table 85 via a terminal 61 from the held counted value $N_S$ obtained from the register 83 via a terminal 60. An output signal of the subtracting circuit 63 is essentially divided by ½ or ¼ by appropriate selected bits depending on the control signal from the signal controller 84, that is, depending on the tape transport direction. The encoder 65 encodes an output signal of the bit selector 64 to an appropriate duty cycle value and supplies this duty cycle value to the variable duty signal generator 87 via a terminal 66.

In order to obtain the same sensitivity for the control of the motor 28 for the speed ratio of 150 with the tape 12 transported in the forward and reverse directions, that is, in order to make the rate of change of the duty cycle coincide with the ratio between the target speed and the actual speed (relative linear velocity detected from the pilot signal), the difference between the held counted value $N_S$ and the target counted value $N_C$ in the duty selected circuit 86 is varied responsive to a control signal from the system controller 84.

The kinds of duty cycles (for example, seven kinds) and the rate of change of the duty cycle (constant rate in FIGS. 13(A) through 13(G)) should be set to easily controllable values.

The accuracy with which the motor 18 is controlled may be improved by using as the counted values $N_S$ and $N_C$ values corresponding to several periods (for example, four periods) of the pilot signal and setting many kinds of duty cycles. In addition, it is possible to carry out a smooth control which is virtually unaffected by jitter, by using as the held counted value $N_S$ an average value of a plurality fo counted values instead of using one counted value.

An equalizer circuit 88 subjects the reproduced RF signal from the head amplifier 14 to an equalization. The equalizer circuit 88 usually comprises delay lines and the delay time thereof is controlled responsive to an output control signal of the system controller 84. For example, the delay time is switched between a delay time for the speed ratio of 25 and a delay time for the speed ratio of 150. The output signal of the equalizer circuit 88 is supplied to a level comparator within a PLL circuit 89 and an output square wave signal of the level comparator is latched in a latch circuit of the PLL circuit 89. Circuits similar to those shown in FIGS. 7 through 9 may be used for the equalizer circuit 88 and the PLL circuit 89, and illustration and description thereof will be omitted.

According to the third embodiment, in addition to the advantageous effects obtainable in the first and second embodiments, the time required for a search may be minimized and the accuracy with which a target position on the magnetic tape is reached is improved, because the rotational speed of the reel driving motor is controllable in a plurality of stages. Moreover, only one duty signal having the varied duty cycle is required to control the driving circuit, and the variable duty signal generator for generating the duty signal can be realized by a simple logic circuit suited for production in the form of an integrated circuit.

FIG. 15 shows a fourth embodiment of the recording and reproducing apparatus according to the present invention. In FIG. 15, those parts which are the same as those corresponding parts in FIG. 1 are designated by the same reference numerals, and description thereof will be omitted. A counted value held in a register 92 is supplied to a signal generator 94 which converts the counted value into a signal having a period which is the counted value based on the clock pulses from the crystal oscillator 21. The output signal of the signal generator 94 is supplied to a PLL control circuit 95. The output signal frequency of a PLL circuit 97 is equal to the transmission frequency $f_{ch}$ (9.408 MHz in this case) during the normal reproduction and changes depending on the relative linear velocity during the high-speed reproduction mode. The change in the output signal frequency of the PLL circuit 97 during the high-speed reproduction mode is the same as the change in the normalized value $r_B$. Accordingly, during the normal reproduction mode and the high-speed reproduction mode, a ratio between the period of the output signal of the PLL circuit 97 and the period of the output signal of the signal generator 94 is 1:72 or a constant ratio very close to 1:72 while the PLL circuit 97 is locked in.

The PLL control circuit 95 compares the period of the output signal of the PLL circuit 97 amounting to 72 clock pulses and the period of the output signal of the signal generator 94, and supplies to the PLL circuit 97 a control signal dependent on the difference in the two periods. For example, when the period of the output signal of the signal generator 94 is considerably shorter than the period of the output signal of the PLL circuit 97 amounting to 72 clock pulses, it is assumed that the output signal frequency of the PLL circuit 97 is low and the PLL circuit 97 is controlled so as to increase the output signal frequency thereof. On the other hand, when the period of the output signal of the signal generator 94 is considerably longer than the period of the output signal of the PLL circuit 97 amounting to 72 clock pulses, it is assumed that the output signal frequency of the PLL circuit 97 is high and the PLL circuit 97 is controlled so as to decrease the output signal frequency thereof.

Circuits similar to those shown in FIGS. 7 through 9 may be used for an equalizer circuit 96 and the PLL circuit 97. FIG. 16 shows the case where a PLL circuit identical so that shown in FIG. 9 is used for the PLL circuit 97. In FIG. 16, those parts which are the same as those corresponding parts in FIGS. 9 and 15 are designated by the same reference numerals, and description thereof will be omitted.

The reproduced signal from the head amplifier 14 is subjected to an equalization in the equalizer circuit 96 and is then supplied to level comparator 70 of the PLL circuit 97 shown in FIG. 16. The output square wave signal of the level comparator 70 is supplied to the data latch circuit 71 and the phase comparator 72 as described before.

The tape 12 is wrapped around the peripheral surface of the head drum 13 for the predetermined angular range (for example, 90°) and transported, and the heads HA and HB are mounted on the head drum 13 with the angular separation of 180° on the rotational plane of the head drum 13. Hence, the head HA or HB scans the tape 12 and produces a reproduced signal for every 90° rotation of the head drum 13, and the reproduced signal is obtained in a burst form. In other words, during a 180° rotation of the head drum 13, there is a time period corresponding to a 90° rotation of the head drum 13 in which neither the head HA nor the head HB scans the tape 12. During this 90° rotation of the head drum 13 in which neither the head HA nor the head HB scans the tape 12, no reproduced signal is obtained, and there is no information for the phase comparison in the PLL circuit 97. As a result, the output oscillation frequency of the VCO 74 deviates with respect to the transmission rate of the reproduced signal or greatly deviates due to the phase comparison carried out by using noise as the information for the phase comparison. In such a case, it takes a long time for the PLL circuit 97 to lock-in when the next reproduced signal is obtained.

In the present embodiment, the PLL circuit 97 is controlled in the following manner so as to eliminate the above described problems.

During the high-speed reproduction, the period of the pilot signal in the normal reproduction mode which may be obtained by counting 72 output clock pulses of the crystal oscillator 21 is greatly different from the period of the output signal of the signal generator 94. The PLL control circuit 95 detects the large difference and changes the frequency characteristic of the equalizer circuit 96 into a predetermined frequency characteristic, and also changes the lock-in range of the PLL circuit 97 into a range wider than that during the normal reproduction mode by known means. It is also possible to change the frequency characteristic of the equalizer circuit 96 and change the lock-in range of the PLL circuit 97 responsive to an output control signal of the system controller 93 depending on the high-speed reproduction mode which is selected, as indicated by a phantom line in FIG. 15.

When the PLL circuit 97 is erroneously locked-in or the output oscillation frequency of the VCO 74 is greatly deviated with respect to the transmission rate of the reproduced signal, the period of the output signal of the PLL circuit 97 amounting to 72 clock pulses is greatly different from the period of the output signal of the signal generator 94. Thus, a control signal for forcibly setting the output error voltage of the phase comparator 72 within the PLL circuit 97 shown in FIG. 16 to a high or low level is supplied to the phase comparator 72 from the PLL control circuit 95, the output oscillation frequency of the VCO 74 is controlled so that the difference in the two periods approaches zero.

Therefore, the digital signal can be reproduced stably even during the high-speed reproduction mode. In addition, it is possible to stably control the PLL circuit 97 even in the case where the reproduced signal is obtained intermittently.

During the normal reproduction mode or a reproduction mode in which the transmission rate is approximately the same as that during the normal reproduction mode, the counted value $N_P$ in the counter 17 in one period of the reproduced pilot signal is "72" as described before, and this counted value "72" is known. Hence, during these reproduction modes, the system controller 93 controls the held counted value in the register 92 to the fixed value "72", so that the PLL circuit 97 can be controlled. In this case, it is possible to stably control the PLL circuit 97 regardless of the capability of detecting the pilot signal.

When counting to detect the pilot signal, the counted value $N_S$ within the range defined by the relation (5) only has a resolution of one clock pulse. In order to increase the detecting accuracy, the repetition frequency of the output clock pulses of the crystal oscillator 21 should be increased. Alternatively, since ten clock pulses exist within one ATF region in the case of the pilot signal, for example, it is possible to increase the detecting accuracy by holding a period amounting to several clock pulses. For example, in the case where the output clock pulse frequency of the crystal oscillator 21 is four times higher, the counted value in one period of the pilot signal during the normal reproduction mode becomes "288" ($=4\times72$) and the resolution per output clock pulse of the crystal oscillator 21 is improved. In addition, in the case where the period amounting to four clock pulses of the pilot signal is counted, it is possible to similarly obtain the counted value "288" and the detecting accuracy can be increased.

In the case where the equalizer circuit 96 is constituted by CCDs, the delay time is determined by the clock pulse frequency (sampling period) and the number of stages of the CCDs, as is well known. Hence, in this case, the sampling period may be controlled responsive to the output oscillation frequency of the VCO 74 within the PLL circuit 97 the operation of which is switched by the output signal of the PLL control circuit 95.

According to the present embodiment, in addition to the advantageous effects obtainable in the first through third embodiments described before, it is possible to constantly control the PLL circuit even during a time period in which no reproduced pilot signal is obtained, because the counted value is held until the next counted value is obtained. In addition, it is possible to considerably shorten the time it takes for the PLL circuit to lock-in when the next reproduced signal is obtained.

The PLL circuit can be stably controlled, and the digital signal can be reproduced stably even during the high-speed reproduction mode.

Further, the present invention is not limited to these embodiments, but various variations and modifications may be made without departing from the scope of the persent invention.

What is claimed is:

1. A digital signal recording and reproducing apparatus comprising:
    tape transport means comprising a reel driving motor for transporting a magnetic tape in a predetermined direction at a tape transport speed that is varied by said tape transport means;
    rotary magnetic heads for recording and reproducing digital signals on and from the magnetic tape, said digital signals including a digitally modulated information signal and a specific signal having a specific frequency which is in a frequency region different from that of the digitally modulated information signal;
    frequency selecting means for frequency-selecting said specific signal from the reproduced digital signals from said rotary magnetic heads;
    measuring means for measuring a period of said specific signal frequency-selected by said frequency selecting means; and
    control means including means for calculating a transmission rate of the reproduced digital signals from the measured period of said specific signal and means for controlling said tape transport means so that the transmission rate of the reproduced signals becomes within a predetermined range.

2. A digital signal recording and reproducing apparatus as claimed in claim 1 which further comprises a phase locked loop circuit for producing from the reproduced digital signals a clock signal and digital data which are to be processed in a digital signal processing system of said digital signal recording and reproducing apparatus, said rotary magnetic heads rotating at a constant rotational speed in a high-speed reproduction mode in which the magnetic tape is transported at a speed higher than that at the time of a recording mode or a normal reproduction mode, said control means supplying to said phase locked loop circuit a control signal for changing a lock-in range of said phase locked loop circuit to a lock-in range different from that in the normal reproduction mode dependent on the transmission rate of the reproduced digital signals.

3. A digital signal recording and reproducing apparatus as claimed in claim 1 in which said control means supplies a control signal for controlling a rotational speed of said reel driving motor so that the transmission rate of the reproduced digital signals becomes constant in a high-speed reproduction mode in which the magnetic tape is transported at a speed higher than that at the time of a recording mode or a normal reproduction mode.

4. A digital signal recording and reproducing apparatus as claimed in claim 1 which further comprises a phase locked loop circuit for producing from the reproduced digital signals a clock signal and digital data which are to be processed in a digital signal processing system of said digital signal recording and reproducing apparatus, said control means supplying a control signal for controlling said phase locked loop circuit so that a frequency ratio between an output signal frequency of said phase locked loop circuit and a frequency of said specific signal becomes a constant ratio.

5. A digital signal recording and reproducing apparatus as claimed in claim 1 in which said specific signal is a pilot signal which is used for controlling tracking of said rotary magnetic heads, said pilot signal having a lowest frequency out of a plurality of low-frequency signals recorded in a region where an automatic tracking code is recorded.

6. A digital signal recording and reproducing apparatus comprising:
tape transport means comprising a reel driving motor for transporting a magnetic tape in a predetermined direction at a tape transport speed that is varied by said tape transport means;
rotary magnetic heads for recording and reproducing digital signals on and from the magnetic tape, said digital signals including a digitally modulated information signal and a specific signal having a specific frequency which is in a frequency region different from that of the digitally modulated information signal;
frequency selecting means for frequency-selecting said specific signal from the reproduced digital signals from said rotary magnetic heads;
measuring means for measuring a period of said specific signal frequency-selected by said frequency selecting means;
holding means for holding a value measured in said measuring means;
signal generating means comparing the held value in said holding means with a calculated target value and for generating a control signal having a duty cycle dependent on the compared result; and
control means for controlling said tape transport means so that the tape transport speed varies dependent on said compared result.

7. A digital signal recording and reproducing apparatus as claimed in claim 6 which further comprises memory means having a look-up table for storing calculated target values for various speed ratios between a tape transport speed in a present reproduction mode and a tape transport speed in a normal reproduction mode, said tape transport speed in said normal reproduction mode being identical to a tape transport speed in a recording mode, said signal generating means reading out one of the stored calculated target values from said look-up table depending on said present reproduction mode.

8. A digital signal recording and reproducing apparatus comprising:
rotary magnetic heads for recording and reproducing digital signals on and from a magnetic tape, said digital signals including a digitally modulated information signal and a specific signal having a specific frequency which is in a frequency region different from that of the digitally modulated information signal;
a phase locked loop circuit for supplying to a digital signal processing system of said digital signal recording and reproducing apparatus a clock signal and the digitally modulated information signal obtained from the reproduced signals from said rotary magnetic heads;
frequency selected means for frequency-selecting said specific signal from the reproduced digital signals from said rotary magnetic heads;
measuring means for measuring a period of said specific signal frequency-selected by said frequency selecting means;
holding means for holding a value measured in said measuring means;
signal generating means for generating a signal having a period dependent on the value held in said holding means; and
control means for comparing the period of the signal generated by the signal generating means and a period of the output clock signal of said phase locked loop circuit to obtain a ratio of the two periods and for controlling said phase locked loop circuit so that said ratio becomes constant.

9. A digital signal recording and reproducing apparatus comprising:
rotary magnetic heads for recording and reproducing digital signals on and from a magnetic tape, said digital signals including a digitally modulated information signal and a specific signal which is in a frequency region different from that of the digitally modulated information signal;
a phase locked loop circuit for supplying to a digital signal processing system of said digital signal recording and reproducing apparatus a clock signal and the digitally modulated information signal obtained from the reproduced signals from said rotary magnetic heads;

frequency selecting means for frequency-selecting said specific signal from the reproduced digital signals from said rotary magnetic heads;

measuring means for measuring a period of said specific signal frequency-selected by said frequency selecting means;

holding means for holding a value measured in said measuring means;

signal generating means for generating a signal having a period dependent on the value held in said holding means;

control means for comparing the period of the signal generated by the signal generating means and a period of the output clock signal of said phase locked loop circuit so that a ratio of the two periods becomes a constant ratio; and means for controlling said holding means to hold a fixed value instead of the value measured in said measuring means in a normal reproduction mode and a special reproduction mode in which a transmission rate of the reproduced digital signal is approximately the same as that in the normal reproduction mode, said normal reproduction mode being a reproduction mode in which a tape transport speed is identical to that in a recording mode, said fixed value being the period of said specific signal which is known.

* * * * *